United States Patent

Yoshida et al.

[11] 3,949,403
[45] Apr. 6, 1976

[54] REMOTE POWER CONTROL APPARATUS

[75] Inventors: Susumu Yoshida, Tokyo; Hisao Okada, Yokohama, both of Japan

[73] Assignee: Sony Corporation, Tokyo, Japan

[22] Filed: Jan. 23, 1975

[21] Appl. No.: 543,341

[30] Foreign Application Priority Data
Jan. 29, 1974 Japan............................ 49-12574[U]

[52] U.S. Cl.............................. 343/225; 343/228
[51] Int. Cl.² ........................................ H04Q 7/00
[58] Field of Search......... 340/310 R; 343/225, 228; 307/117; 325/392, 389, 394

[56] References Cited
UNITED STATES PATENTS

| | | | |
|---|---|---|---|
| 2,912,574 | 11/1959 | Gensel | 343/228 |
| 3,440,347 | 4/1969 | Spencer | 343/225 X |

*Primary Examiner*—Harold I. Pitts
*Attorney, Agent, or Firm*—Lewis H. Eslinger; Alvin Sinderbrand

[57] ABSTRACT

Remotely actuated power control apparatus having a control signal processing circuit which receives a remote control signal emitted from a remote transmitter and controls a power switch of an electronic instrument. The control apparatus includes a battery connected to the remote control signal processing circuit for supplying an operating voltage to the latter, and it also includes a power supply circuit connected to the electronic instrument substantially in parallel thereto, whereby an electronic power of the electronic instrument is controlled ON and OFF by the power switch.

5 Claims, 1 Drawing Figure

U.S. Patent  April 6, 1976  3,949,403
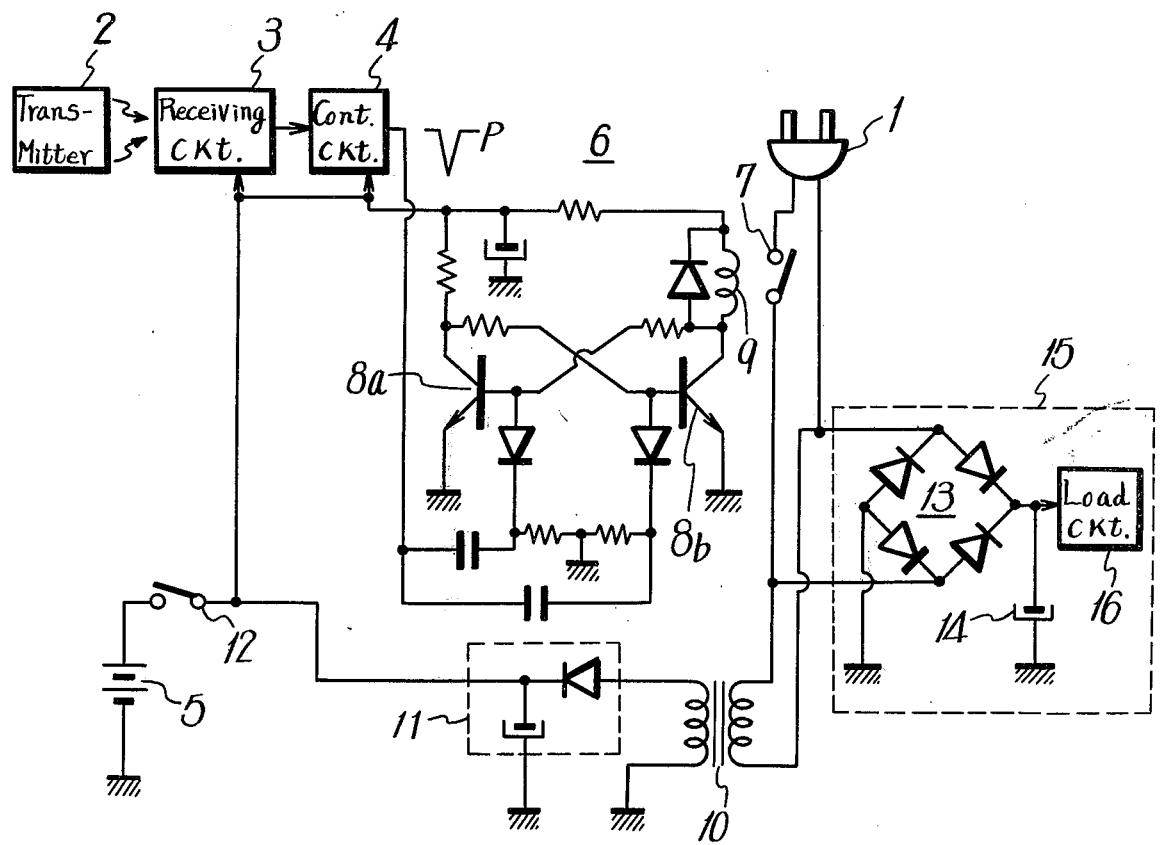

REMOTE POWER CONTROL APPARATUS

BACKGROUND OF THE INVENTION

1. Field of the Invention

The present invention relates generally to a remote power control apparatus, and is directed more particularly to a remote power control apparatus for use with electronic apparatus.

2. Description of the Prior Art

In an electronic instrument such as a television receiver or the like which is remotely controlled, there is frequently provided a receiver for remote control. The receiver for remote control is supplied with electric power from the main power source, such as the usual commercial AC power, even when electric power from the main source to the television receiver proper is turned off. This allows the remote control receiver to be capable of receiving a signal of remote control from a transmitter to cause the electric power source of the television receiver to be turned either ON or OFF. That is, the receiver for remote control provided in the television receiver is always supplied with a commercial AC electric power or the television receiver is always connected with the main electric power source. Therefore, there is a risk that even when the power switch of the television receiver is OFF, excess current may flow from the power source to the remote control receiver due to troubles or accidents in the electronic paths. These may cause fires, which is not a desirable possibility from the safety point of view.

SUMMARY OF THE INVENTION

According to the present invention, remote power control apparatus is provided which comprises a remote control signal processing means to receive control signals transmitted from a remote transmitter and to control a power switch of an electronic device. A battery is connected to the remote control signal processing means for supplying operating voltage thereto, and a power supply circuit for the remote control signal processing means is connected to the electronic apparatus.

Accordingly, an object of the present invention is to provide remote power control apparatus free from the defects encountered in the prior art.

Another object of the present invention is to provide remote power control apparatus which acts to stop the supply of any electric power to the remotely controlled apparatus from a commercial electric power source when the power source is supposed to be OFF.

The other objects, features and advantages of the invention will become apparent from the following description taken in conjunction with the accompanying drawing.

DESCRIPTION OF THE DRAWING

The only FIGURE is a connection diagram showing an embodiment of the remote power control apparatus according to the present invention.

DESCRIPTION OF THE PREFERRED EMBODIMENT

An embodiment of the present invention will be hereinafter described with reference to the drawing.

In the FIGURE, reference numeral 1 designates a plug which may be connected to a commercial AC power source (not shown). A transmitter 2 is provided for producing a remote control signal and a receiving circuit 3 for receiving the remote control signal. An output signal from the receiver 3 is supplied to a control signal generating circuit 4 which may produce a pulse P in response to the remote control signal from the transmitter 2.

In accordance with the present invention, the remote control apparatus includes its own battery 5 and a control circuit 6 to be controlled by the signal from the control signal generating circuit 4. The apparatus also includes a relay, the contacts of which are identified as a switch 7 and are operated by the output signal from the control circuit 6. The switch 7 is used a power source switch for an electronic instrument 15 that includes a load circuit such as a television receiver 16. The receiving circuit 3, the control signal generating circuit 4 and the control circuit form a remote control signal processing means.

In the embodiment illustrated in the drawing, the control circuit 6 is formed as a bistable circuit consisting of a pair of transistors 8a and 8b, mainly. In the collector-emitter path of one transistor 8b there is inserted a relay 9 mentioned previously, the contacts of which serve as the power source switch 7. A rechargable battery is employed as the battery 5. Therefore, when the switch 7 is turned on, an AC current is supplied from the commercial AC power source to a transformer 10, the primary winding of which is connected in parallel to the electronic instrument 15. The AC current in the secondary winding is rectified by a rectifying circuit 11 and then supplied to the processing means and to the battery 5 to charge the latter. A switch 12 is connected between the rectifying circuit 11 and the battery 15 to stop the supply of current by the battery 5 to the processing means to avoid useless power consumption by the processing means when the electronic instrument 15 is not to be used for a relatively long period of time. The commercial AC current through the plug 1 is supplied to a rectifying circuit 13, then smoothed by a capacitor 14 and thereafter applied to the load circuit 16 of the electronic instrument 15.

The operation of the remote power control apparatus of the invention constructed as above will be now described. It is a assumed that the switch 12 is on and the plug 1 is inserted into the commercial AC power source and that the transistor 8b of the bistable circuit 6 is non-conductive and consequently the power switch 7 is off. In such condition, a current is always fed to the receiving circuit 3, the control signal generating circuit 4 and the bistable circuit or control circuit 6, respectively, from the battery 5 to keep them operative. When a signal from the transmitter 2 arrives at the receiving circuit 3, the control signal generating circuit 4 produces the pulse P, which is then supplied to the base electrodes of the transistors 8a and 8b of the bistable circuit 6 to reverse the states of conductivity of the transistors. As a result, the transistor 8a becomes non-conductive and the transistor 8b becomes non-conductive. This causes the coil of the relay 9 to be supplied with the current from the battery 5, thereby causing the power switch 7 to be turned on. The electronic instrument 15 is supplied with the commercial AC current through the switch and so becomes operative. A rectified current is obtained at the output of the rectifying circuit 11 and is applied to charge the battery 5.

When the next signal from the transmitter 2 arrives at the receiving circuit 3, another pulse P is produced at the output of the control signal generating circuit 4.

Thus, the state of conductivity of the bistable circuit 6 is reversed so that the transistor 8a is again made conductive and the transistor 8b is made non-conductive, which turns off the power switch 7. As a result, the power source is completely disconnected from the electronic instrument 15.

As may be apparent from the above description, with the present invention when the power switch of the electronic instrument is turned off, the receiving circuit 3 and other parts of the remote control signal processing means are no longer supplied with current from the commercial AC power source. Since the receiving circuit 3 and other parts of the remote control signal processing means are entirely disconnected from the commercial power source by the power switch 7, even if troubles or accidents may occur, no great amount of alternating current flows in the receiving circuit 3 and other parts of the remote control signal processing circuit. Therefore, any risk encountered in the prior art can be avoided by the invention.

Further, since in the invention the receiving circuit 3, the control signal generating circuit 4 and the control or bistable circuit 6 are always supplied with current from the battery 5, they are always in stand-by state for the signal from the transmitter 2.

In addition, the battery 5 is charged from the rectifying circuit 11 when the power switch 7 is turned on in the illustrated embodiment of the invention, and so the battery is prevented from running down.

It may be apparent that many modifications and variations could be effected by one skilled in the art without departing from the spirit and scope of the novel concepts of the present invention.

We claim as our invention:

1. A remote power control apparatus comprising:
   a. a remote control signal processing means comprising a remote control signal receiving circuit, a switch to connect said apparatus to an external power source only when said switch is closed, and a control circuit actuated by signals from said receiving circuit to close said switch;
   b. a battery connected to said remote control signal processing means for supplying an operating voltage to said remote control signal processing means;
   c. a power supply circuit for said remote control signal processing means, said power supply circuit comprising an input section connected to said switch to be energized from said external power source, and a rectifier section connected to said remote control signal processing means to supply operating power thereto when said switch is closed; and
   d. an electronic instrument comprising a power supply connected to said switch to be energized from said external power source through said switch controlled by said remote control signal processing means.

2. A remote power control apparatus according to claim 1 comprising means to connect said battery in parallel with said rectifier section of said power supply circuit for said remote control signal processing means.

3. A remote power control apparatus according to claim 2, wherein said battery is a rechargable battery.

4. A remote power control apparatus according to claim 1 wherein said control circuit comprises a flip-flop circuit triggered by said control signal generating circuit and a relay comprising contacts operative as said switch to control the supply of power to said electronic instrument, said relay being driven by said flip-flop circuit.

5. A remote power control apparatus according to claim 3 in which said means to connect said battery in parallel with said rectifier section comprises a second switch in series with said battery to permit said battery to be disconnected from said rectifier section and said remote control signal processing means.

* * * * *